United States Patent
Lee et al.

[11] Patent Number: 6,051,461
[45] Date of Patent: Apr. 18, 2000

[54] MEMORY INTEGRATED CIRCUIT AND METHODS FOR MANUFACTURING THE SAME

[75] Inventors: Woo-Bong Lee, Ich'on; Heung-Gee Hong, Songnam; Young-Mo Koo, Ich'on, all of Rep. of Korea

[73] Assignee: Hyundai Electronics Industries Co., Ltd., Kyoungki-do, Rep. of Korea

[21] Appl. No.: 09/099,157

[22] Filed: Jun. 18, 1998

Related U.S. Application Data

[62] Division of application No. 08/662,415, Jun. 10, 1996, Pat. No. 5,812,443.

[51] Int. Cl.[7] .............................................. H01L 21/8242
[52] U.S. Cl. .................... 438/241; 257/306; 257/337; 257/296; 438/587; 438/365
[58] Field of Search ................ 438/365, 241, 438/587; 365/149, 150; 257/296, 298, 306

[56] References Cited

U.S. PATENT DOCUMENTS

| | | | |
|---|---|---|---|
| 5,526,303 | 6/1996 | Okajima | 365/154 |
| 5,583,358 | 12/1996 | Kimura et al. | 257/306 |
| 5,635,742 | 6/1997 | Hoshi et al. | 257/337 |
| 5,955,757 | 9/1999 | Jen et al. | 257/296 |

FOREIGN PATENT DOCUMENTS

| | | |
|---|---|---|
| 0637035 | 2/1995 | European Pat. Off. . |

OTHER PUBLICATIONS

S. Wolf, "Silicon Processing for the VLSI Era; vol. 2, Process Integration", Lattice Press, Sunset Beach California 1990, pp. 201–203; 368–370.

*Primary Examiner*—Joni Chang
*Assistant Examiner*—Calvin Lee
*Attorney, Agent, or Firm*—Ware, Fressola, Van Der Sluys & Adolphson LLP

[57] ABSTRACT

A memory integrated circuit which is driven with a low power and reduced the cell area and a method for manufacturing the same. A plurality of active regions having an H-shape with four source regions and common drain region are formed on a semiconductor substrate. Four word lines each having a different source correspondingly pass through each of the four source regions of an active region, thereby forming four transistors driven, independently. These four transistors are designed so as to share one bit line, thereby reducing the driving voltage of the transistor to ¼ Vcc. With a low power driving source, four transistors and a capacitor are formed on a small area to thereby reduce the cell size to 33% and even more.

5 Claims, 5 Drawing Sheets

MEMORY INTEGRATED CIRCUIT AND METHODS FOR MANUFACTURING THE SAME

This application is a divisional of Ser. No. 08/662,415, filed on Jun. 10, 1996, now U.S. Pat. No. 5,812,443.

BACKGROUND OF THE INVENTION

1. Field of the Invention

The present invention relates to a memory integrated circuit and methods for manufacturing the same, and more particularly, to a memory integrated circuit which is driven with a low power while having a structure wherein a cell area can be reduced and methods for manufacturing the same.

2. Description of the Prior Art

In recent years, a remarkable spread of information processing equipment such as computers has been increasing demand for semiconductor memory devices. In particular, semiconductor memory devices having a large storage capacity and operable at a high speed are in great demand, which demand is followed by technological development to improve integration density, response and reliability of semiconductor memory devices.

Among semiconductor memory devices, a DRAM (Dynamic Random Access Memory) is well known as a memory which enables randon input and output of storage information. A DRAM generally comprises a memory cell array portion serving as a storage region wherein a great deal of storage information is stored and a peripheral circuit portion for inputting/outputting external signals.

The memory cells each array portion includes a memory cell comprising one transistor and one capacitor, and a bit line for transferring electric charges stored in the capacitor of the memory cell.

The peripheral circuit portion includes a Vcc power supply portion and a column decoder.

For writing to a conventional DRAM having such an arrangement, a column decoder in the peripheral circuit portion or the like first designates a memory cell. Then, signal charges are transmitted through the bit line to the designated memory cell. The signal charges transmitted through bit line are transmitted to a storage node of the capacitor by applying predetermined charges to a gate electrode. The signal charges transmitted to the storage node are stored in the capacitor. In a reading operation, signal charges are transmitted onto the bit line by applying a predetermined voltage to the gate electrode. The signal charges transmitted onto the bit line are externally read out through the column decoder.

Recently, in a semiconductor memory device, it is required that an area of each portion in the semiconductor memory device is made small in accordance with increasing of the capacity of a bit line. It is useful for decreasing the occupancy area of each portion in the semiconductor memory device to minutely form a configuration of the semiconductor memory device, and to provide efficient interconnections.

FIG. 1 is a plan view of a first example of a semiconductor device incorporating a contact structure according to a first conventional method, and FIG. 2 is a sectional view taken along II-II' in FIG. 1. As shown in FIG. 1, word lines 2 are formed spaced apart at a determined distance on a semiconductor substrate (not shown), and in a row pattern. Bit lines 8 are formed perpendicular to word lines 2 and parallel to one another. Field oxide films 1 are located between the bit lines 8 and word lines 2.

Referring now to FIG. 2, a conventional method of forming a semiconductor device is described below. First, predetermined portions of a semiconductor substrate 100 is field-oxidized to form field oxide films 1. Portions on the semiconductor substrate 100 which are not formed with the field oxide films 1 serve as active regions 200. A gate oxide film 10A then, is formed on the entire surface of the semiconductor substrate 100 typically by a thermal oxidation technique, covering the exposed area of the semiconductor substrate 100. A polysilicon layer is then conformally deposited over entire surface of the resultant semiconductor structure. The polysilicon layer thus formed on the semiconductor substrate 100 is patterned and etched to form the word lines 2 on the gate oxide film 10A. Thereafter, an oxide film is formed on the entire surface of the resultant structure typically by chemical vapor deposition(CVD) technique and is etched with for example, a reactive ion eating (RIE) technique thereby to form spacer 10B. Hereinafter, the gate oxide film 10A and the spacer 10B formed on both sides of the word line 2 are called the word line 2.

In order to form self-aligned a source region 3 and a drain region 4 of each transistor, the word lines 2 are then used as a mask for injecting dopant such a phosphorus into the semiconductor substrate 100. At this step, as shown in this figure, an impurity region located between word lines 2 is used as a drain region 4, and two transistors share one drain region 4. Then, a first insulating film 5 is deposited to a predetermined thickness on the semiconductor substrate 100 on which the transistors are formed. The first insulating film 5 is etched away so as to expose the source region 3. Then, on the exposed source region 3, a capacitor 7 for storing information charge of the memory device is formed. At this time, a contact region of the source region 3 and the capacitor 7 is called a storage node contact region 3A. Thereafter, a second insulating film 6 is deposited to a predetermined thickness on the entire surface of the semiconductor substrate 100 on which the capacitor 7 is formed. A portion of the second insulating film 6 is etched away so as to expose the drain region 4. A bit line 8 is formed so as to be in contact with the exposed drain region 4 to form a bit line contact 4A.

FIG. 3 is a cross-sectional view taken along line III-III' in FIG. 2 and shows the shape of an active region of the integrated circuit memory.

As shown in FIG. 3, an active region 200 is formed on a semiconductor substrate (not shown) so as to be a 90 degree rotated-I shape i.e., not upright with respect to the figure. For reducing a unit cell area of a transistor, two transistors are formed in one active region 200. That is, two word lines 2 are formed so as to pass one active region 200. A source (not shown in FIG. 3) and a drain (not shown in FIG. 3) are formed in the active region 200 on respective sides of the word line 2, as shown in FIG. 2. Further, a capacitor (not shown in FIG. 3) for storing a charge is in contact with the source, thereby forming the storage node contact region 3A. The drain is in contact with a bit line (not shown in FIG. 3), thereby forming the bit line contact region 4A.

As described above, the conventional memory integrated circuit having the active region of the 90 degree rotated-I shape has a pair of transistors, the pair of transistors share one drain in one active region. For this reason, in order to drive two transistors formed in one active region, at least a voltage of ½ Vcc is necessary. Therefore, it is difficult to satisfy the recent tendency requiring low power.

Further, in the view of the above method for manufacturing the memory integrated circuit, since the capacitor is formed before forming the bit line, the step-coverage caused due to the capacitor is adversely affected. Step coverage is a known measure of how well a film maintains its nominal thickness as it crosses over high and steep steps and is expressed by the ratio of the minimum thickness of a film as it crosses a step to the nominal thickness of the film on horizontal regions. Due to this, when forming the bit line, the contact of the bit line and the drain is not formed easily, thereby causing a poor interconnection. In addition, it is difficult to enlarge the area of the capacitor.

In order to overcome such problems, as another conventional embodiment, there is suggested a method where a capacitor is formed after a bit line is formed.

As shown in FIG. 4, an active region 200 is formed in a semiconductor substrate (not shown) by known field oxidation methods. Word lines 2 are formed parallel to each other on active region 200 and a field oxide film 1, being spaced apart by a predetermined distance. Bit lines 8 are formed parallel to each other on active region 200 and a field oxide film 1, each being spaced apart by a predetermined distance so as to be perpendicular to each of the word lines 2.

FIG. 5 is a cross-sectional view taken along line V-V' of FIG. 4.

As shown in FIG. 5, an active region 200 is defined in a semiconductor substrate 100 by a conventional field oxidation technique. A Word line 2 is formed on a predetermined portion of the semiconductor substrate 100 by the known technique. An impurity ion is implanted into the active region 200 exposed by a field oxide film 1 and the word line 2, thereby forming a source region 3, and a drain region 4. A first insulating film 5 is deposited on the semiconductor substrate 100 on which a transistor is formed. The first insulating film 5 is etched to expose the drain region 4 of the transistor. A bit line 8 is formed so as to be in contact with the exposed drain region 4. At this time, a portion where the drain region 4 and the bit line 8 are in contact with each other is called a bit line contact region 4A. Then, a second insulating film 6 is deposited on entire surface of the semiconductor substrate 100 on which the bit line 8 is formed. Predetermined portions of the second insulating film 6 and the first insulating film 5 are in turn etched to expose source region 3. A capacitor 7 for storing information is formed on the source region 3. At that time, a portion where source region 3 and the capacitor 7 are in contact with each other is called a storage node contact region 3A.

FIG. 6 is a cross-sectional view taken along line VI-VI' of FIG. 5, and shows the shape of the active region of the memory integrated circuit.

With the conventional 90 degree rotated-I shape, it is difficult to form the bit line before forming of the capacitor. Therefore, the active region 200 of an reverse-T shape is formed. The word lines 2 are formed so as to pass two by two the respective active regions 200. In the active region 200 of reverse-T shape, two sources (not shown) are formed on respective sides of the word lines 2 of the direction of X-axis (left to right with respect to Figure), and a drain (not shown) is formed between the word line 2 in the direction of Y-axis (up and down with respect to the Figure).

The source is in contact with a capacitor (not shown), and this portion is called a storage node contact region 3A. The drain is in contact with a bit line (not shown), and this portion is called a bit line contact region 4A.

According to the last described method for manufacturing the memory integrated circuit, the memory integrated circuit having the reverse-T shape active region forms the bit line and the capacitor by changing the manufacturing steps thereof, thereby improving the step-coverage. However, from a structural view, two transistors are formed on one active region as usual. Thus, it is difficult to drive the transistor by a low power. Further, the area of the active region is increased by the leg portion of the reverse-T shape, thus the area of the cell is increased to about 33%.

SUMMARY OF THE INVENTION

It is an object of the present invention to provide a memory integrated circuit in which more than two transistors formed in one active region, while permitting low power driving.

It is another object to the present invention to provide a memory integrated circuit in which the size of an active region is reduced to thereby realize the higher degree of integration.

It is further object to the present invention to provide a method for manufacturing a memory integrated circuit in which the surface step-coverage thereof is improved to thereby enhance the reliability of the device.

In order to accomplish the above objects, there is provided a memory integrated circuit comprising active regions formed on a semiconductor substrate, each having an H-shape; a word line passing each active region; global word lines connected to the respective word lines; strapping word lines for connecting the word lines that are not connected to the global word lines; sources and drains formed in the active regions on opposite sides of the word line; bit lines that are in contact with the drains of the active regions; and capacitors that are in contact with the source and store a charge of the memory integrated circuit, wherein the word lines pass four by four for each active region and the four word lines are driven, independently.

Further, for accomplishing the further object, in a method for manufacturing a memory integrated circuit of the present invention, field oxide films are formed on a semiconductor substrate of a first conductivity type so that active regions are formed in an H shape are formed. Word lines are formed on the active regions of the semiconductor substrate that are not field oxidized. Sources and drains of a second conductivity type are formed in the active region exposed between the word lines. A first insulating film is formed on the semiconductor substrate on which the transistors are formed. The first insulating film is removed to expose predetermined portions of the word lines that are not connected to a power source and the drains. Bit lines connected to the exposed drains are formed on the semiconductor substrate, at same times strapping word lines connected to the word lines that are not connected to the power source are formed on the semiconductor substrate. These and other objects, features and advantages of the present invention will become more apparent in light of the detailed description of a best mode embodiment thereof, as illustrated in the accompanying drawing.

BRIEF DESCRIPTION OF THE ATTACHED DRAWINGS

DETAILED DESCRIPTION OF THE INVENTION

Figure 1:
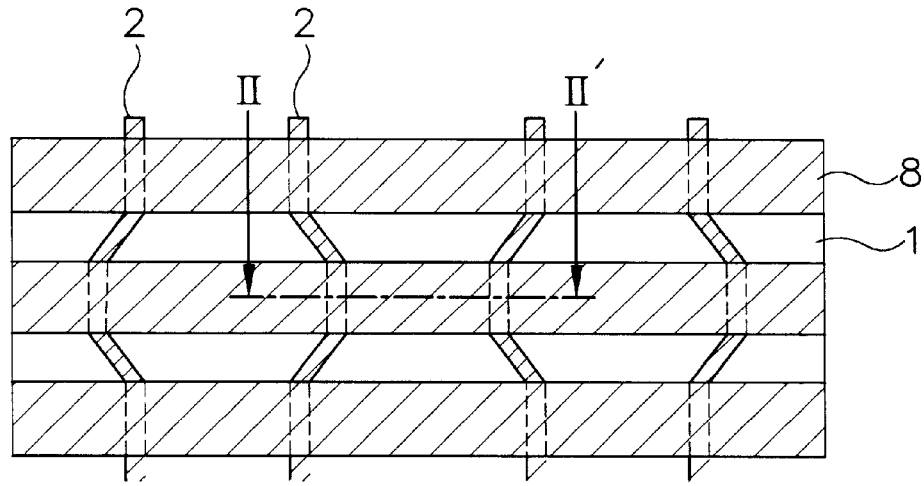
FIG. 1 is a plan view of a memory integrated circuit having an active region of a 90 degree rotated I shape.
Figure 2:
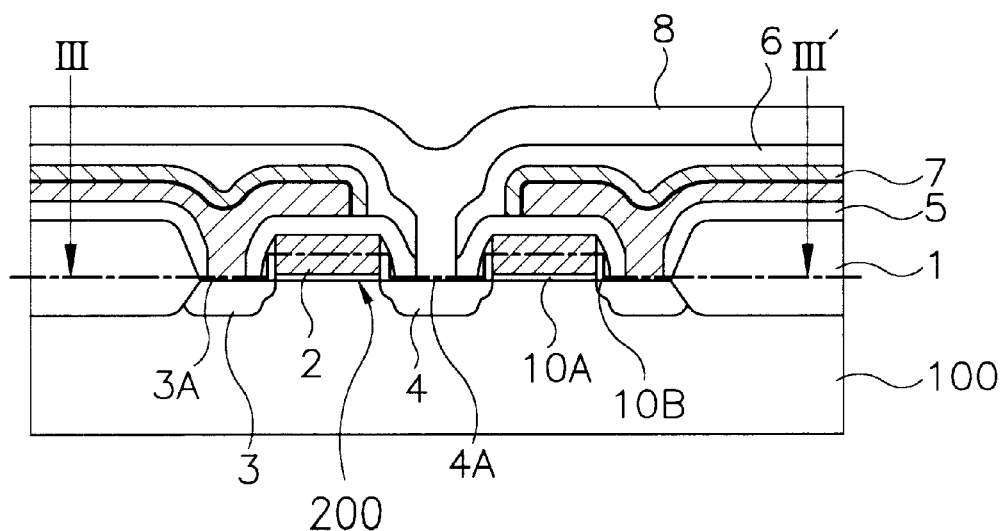
FIG. 2 is a cross-sectional view of the memory integrated circuit having the active region of a 90 degree rotated I shape, taken along line II-II' of FIG. 1.
Figure 3:
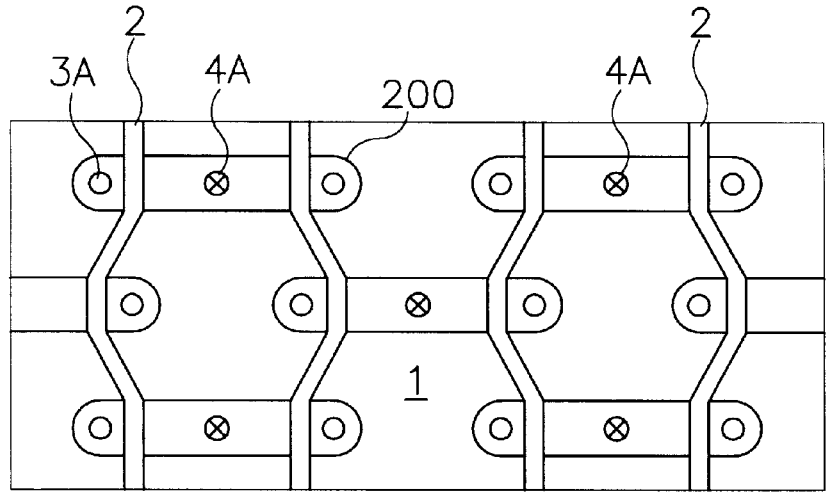
FIG. 3 is a cross-sectional view having the active region of the conventional memory integrated circuit, taken along line III-III' of FIG. 2.
Figure 4:
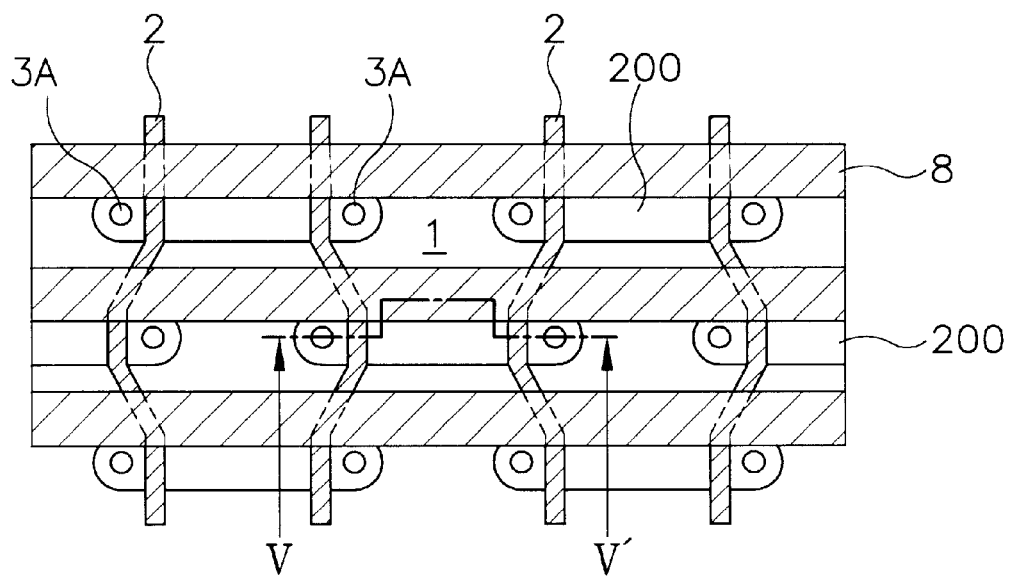
FIG. 4 is a plan view of a memory integrated circuit having an active region of a conventional reverse-T shape.
Figure 5:
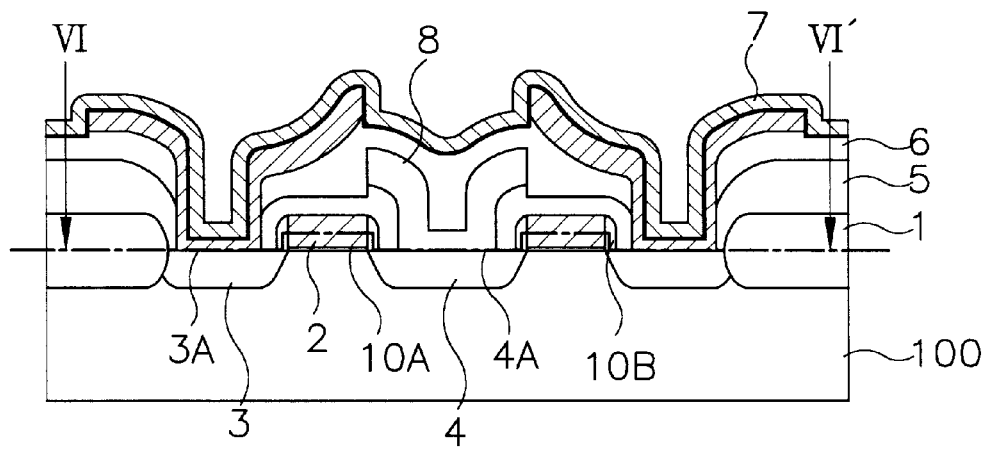
FIG. 5 is a cross-sectional view of the memory integrated circuit, taken along line V-V' of FIG. 4.
Figure 6:
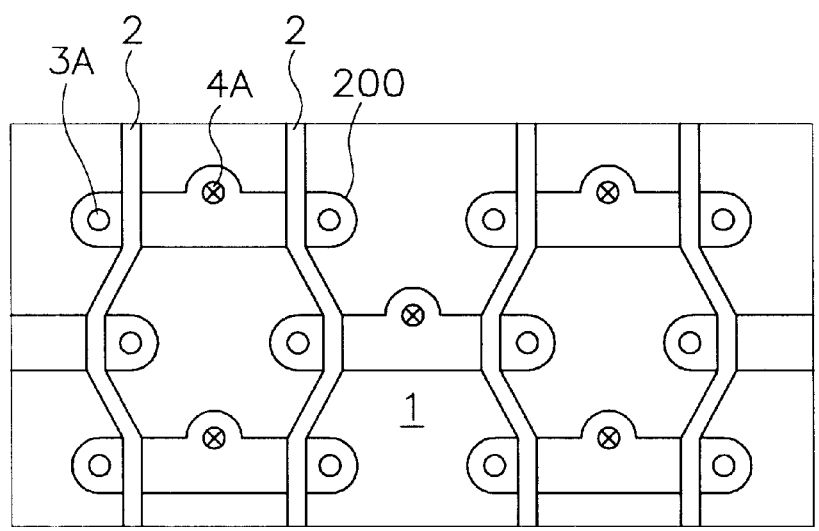
FIG. 6 is a cross-sectional view showing the active region of the memory integrated circuit, taken along line VI-VI' of FIG. 5.

Hereinafter, the preferred embodiment of the present invention will be described with reference to the attached drawings.

In this embodiment, the same reference numerals are used to indicate the same portion as the conventional elements.

Figure 7:
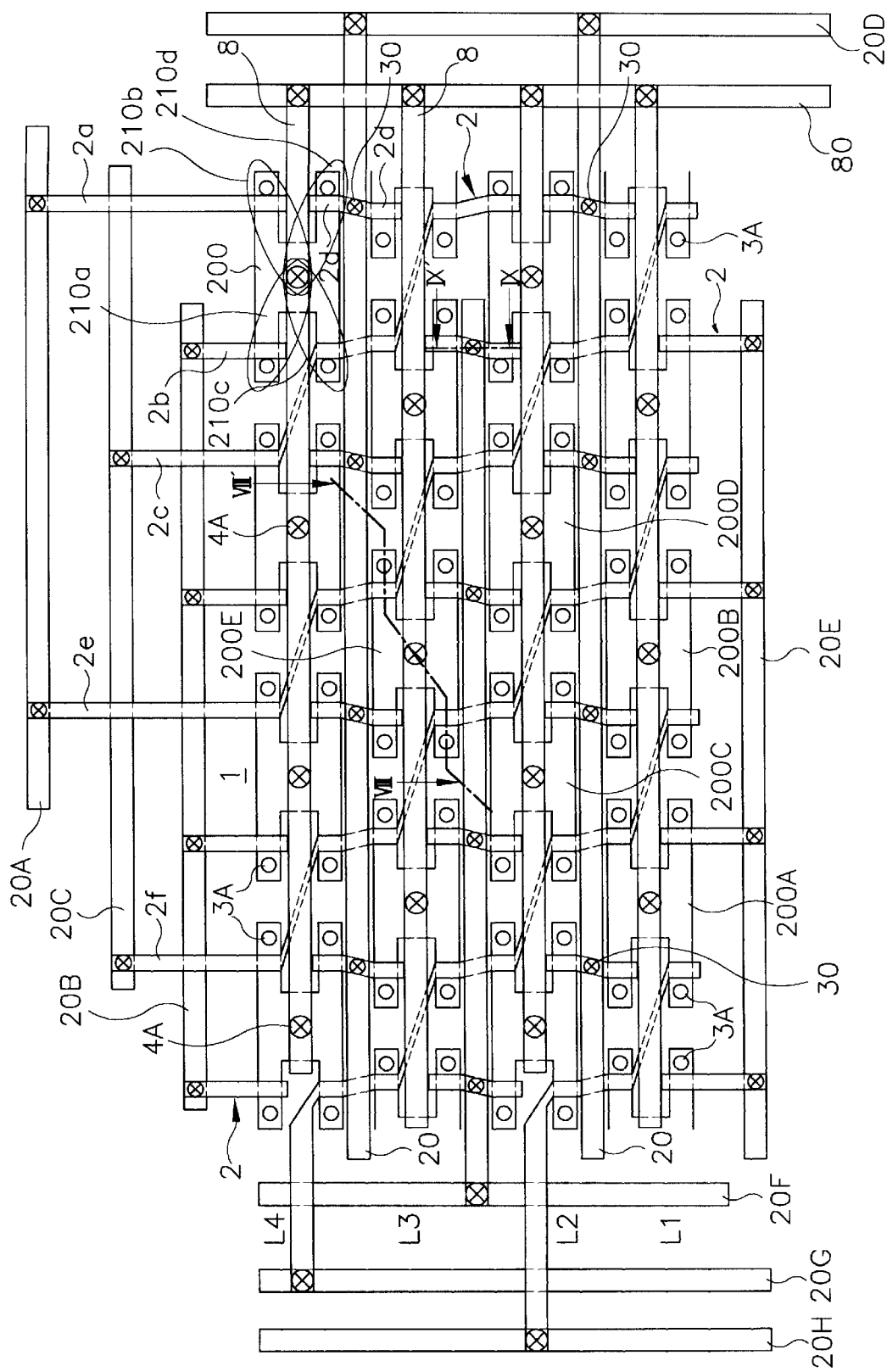
FIG. 7 is a top view of a layout of a memory integrated circuit including an active region of a 90 degree rotated-H shape achieved in accordance with the present invention.

As shown in FIG. 7, a predetermined portion of a semiconductor substrate (not shown) is field-oxidized to define an active region 200. In order to form four transistors 210a, 210b, 210c and 210d within one active region 200, the active region 200 is formed in a 90-degree rotated H-shape with respect to the word lines 2. The H-shaped active regions 200 each have two parallel leg parts and a transverse bridge part joining the leg parts in the middle. The leg parts define four branch portions in extending from the joining bridge part. Four transistors 210a, 210b, 210c and 210d share a common drain 4A.

Word lines 2 are formed so as to pass the four branch portions of active region 200, respectively. Two word lines 2a and 2b passing two upper branch portions of the four branch portions of the active region 200 are connected to two global word lines 20A and 20B, respectively. Another two word lines 2c and 2d passing of the lower branch portion of the four branch portions of the active region 200 are connected to the global word lines 20C and 20D, respectively. That is, word line 2d is in contact with a strapping word line 20 which runs in the X-axis (left to right direction) direction of FIG. 7, thereby forming a word line contact region 30, and the strapping word line 20 is electrically connected to the global word line 20D. A word line 2d extends from the strapping word line 20 to make contact with the lower right branch transistor 210d and also with an upper left branch of the H-shaped region immediately below region 200 in a row or line L3 of active devices, to be described in more detail below. The global word line 20D connected to strapping word line 20 is running in the Y-axis direction of FIG. 7. In this example, it is important that the global word lines 20A, 20D, 20C, 20D are formed so as to be electrically isolated from each other that each of four transistors, which are formed within the active region having a 90 degree rotated-H shape, is not operated simultaneously.

As shown in the example, a plurality of global word lines are formed on the upper and the lower portions, in the direction of X-axis, e.g., two global word lines on the upper portion of the cell region and one global word line 20E on the lower portion thereof. One global word line 20D may be formed on the right and three global word lines 20F, 20G, and 20H on the left, all in the direction of Y-axis (as shown). In this way, the global word lines are located in directions parallel and orthogonal to the branch and bridge portions of the H-shaped active regions. It should be realized that the number and choice of positioning is arbitrary. Then, the word lines 2 in the active region 200 are connected to global word lines 20A, 20B, 20C, 20D, 20E, 20F, 20G and 20H, each of which is independently operated with the time intervals. Thus, all transistors within the same active region may be operated independently within each time interval.

Source (not shown) and drain (not shown) regions are formed in the exposed active region 200 on opposite sides of the word line 2. The drain region is formed on the bridge portion of the active region 200 of the H-shape. The source regions are formed on the four branch portions of the active region of the H-shape, respectively.

Therefore, four transistors are formed within one active region, and four transistors share one drain.

In this example, as suggested above, it is important that the global word lines are formed so that each of the four transistors, which are formed within an active region having a 90-degree rotated H-shape, for example, is not operated simultaneously. Hence, the structure provided must ensure independent operability of the transistors. This form must be suitable for a high degree of integration and must be capable of providing more than two source regions for sharing a comon drain region.

Similarly, the various global word lines are illustrated in only one possible arrangement. For instance, the global word line 20A is shown connected to only two vertical word lines 2a, 2e. The word line 2a is used to energize the transistor 210b only. On the other hand, the word line 2e is used to connect to upper right and lower left sources in two adjacent active regions in all four rows or lines L1–L4, as shown. Word lines 2c, 2f are similar to word line 2e, except being connected to global word line 20C. Global word line 20B has the limited function of contacting the upper left branch of each of the active regions in row or line L4. Global word line 20E is similar to global word line 20B, in that it only connects to the lower right branches of the active regions in row or line L1. Global word lines 20G and 20H are similar in function to global word lines 20A and 20B in contacting the lower left and upper right branches of active regions in successive rows or lines, as shown. It should be realized that many different arrangements are possible. For instance, global word line 20D can be split into two separate global word lines for individually controlling the two strapping lines 20 which are shown between the first and second rows or lines L1, L2, and between the third and fourth lines or rows L3, L4, in both cases for energizing the lower right source branch of the row above and the upper left source branch of the active region in the row below.

In the example, in order to effectively reduce cell size, active region 200 is formed in the shape of a 90 degree rotated-H as shown in FIG. 7. A plurality of active regions 200 are surrounded with field oxide film 1 and arranged apart from each other by a predetermined distance. A first row or line L1 of active region and a third line L3 of the active regions are in the same relative vertical position as each other. A second line L2 and a fourth line L4 of the active regions also have the same relative vertical position as each other. Further, above the field oxide film 1 between the active regions 200A and 200B of the first line L1, the drain of active region 200C of second line L2 is located. In the same way, above field the oxide film 1 between the active regions 200C and 200D of the second line L2, the drain of active region 200E of the third line L3 is also located. The reason for arranging in such pattern is to increase the integrated density of the memory integrated circuit by forming a plurality of active regions on the semiconductor substrate.

Further, a bit line 8 is formed so as to pass the drain of the active region 200, thereby forming a bit line contact 4A. In addition, a plurality of bit lines 8 are tied to a global bit line 80. A storage node capacitor (not shown) is formed on the four branch portions, i.e., the source of the active region 200, thereby making a storage node contact 3A.

Therefore, it will be understood that the strapping word line 20 can be formed by this method without additional process. In other words, word lines 2a, 2b, 2c and 2d formed in the direction of Y-axis are formed as in the conventional method whereas, on the other hand, the bit lines 8, which are formed in the direction of the X-axis in a subsequent process, are formed simultaneously with the strapping word lines 20, in the direction of the X-axis.

Figure 8:
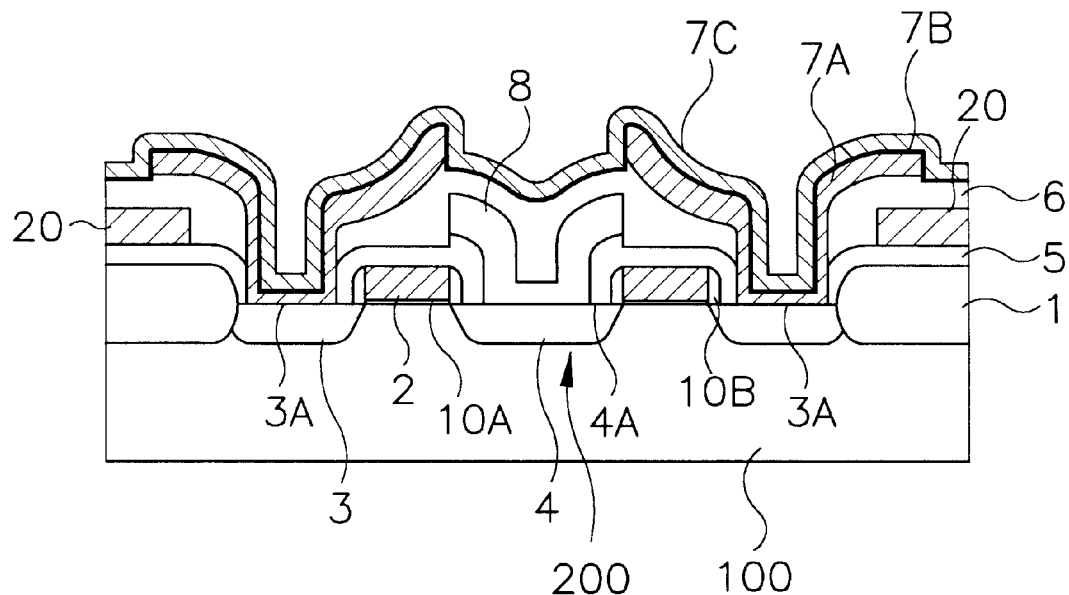
FIG. 8 is a cross-sectional view for illustrating a method for manufacturing the memory integrated circuit, taken along line VIII-VIII' of FIG. 7.

FIG. 8 is a cross-sectional view taken along line VIII-VIII' of FIG. 7. A portion of the semiconductor substrate 100 is selectively field-oxidized, thereby forming the field oxide film 1. At this time, a portion which is not formed with field oxide film 1 becomes the active region 200 in the same way. Then, a gate oxide film 10A and a gate electrode of a polysilicon layer are deposited sequentially by CVD method. The polysilicon is patterned in the direction of Y-axis (see FIG. 7), thereby forming the word line 2. Implantation of an impurity ion of a low concentration in the exposed active region 200 and the formation of a spacer on both sides of the word line 2 using an anisotropic etching technique are followed by the implantation of an impurity ion of a high concentration (not shown). Thus, the source region 3 and the drain region 4 are formed on the active region 200. Then, a first insulating film 5 is deposited conformally on semiconductor substrate 100 on which the transistor is formed. The first insulating film 5 is etched so as to expose drain 4 formed in the active region 200.

Then, a polysilicon for the bit line 8 is deposited on the resultant structure and a predetermined portion thereof is etched away, thereby forming the bit line 8. At this time, the polysilicon for bit line is patterned to bit line 8 and simultaneously, patterned to the strapping word line 20 for connecting a word line 2 that is not connected to a global word line (not shown) on field oxide film 1. Then, a second insulating film 6 is deposited on the semiconductor substrate 100 on which the bit line 8 is formed. At this time, since the field oxide film 1, the word line 2 and the bit line 8 are formed on the underlying resultant structure, the step-coverage is adversely affected. Accordingly, as the second insulating film 6, it is preferred to use a material whose planarization property is excellent such as a BPSG and SOG. The second insulating film 6 is etched so as to expose the source 3 of the active region. Then, a storage node electrode 7A, a dielectric film 7B and a plate electrode 7C are formed by the conventional method, respectively.

Figure 9:
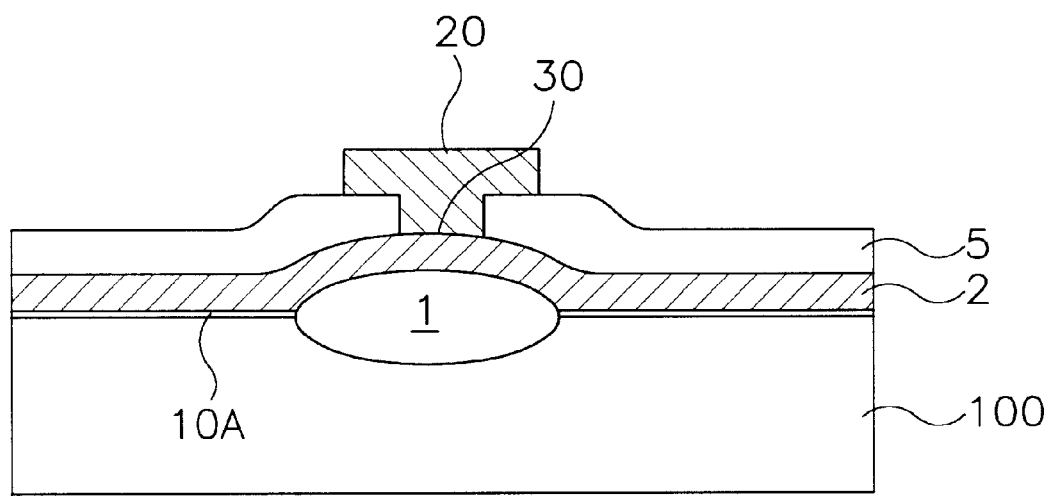
FIG. 9 is a cross-sectional view for illustrating a method for manufacturing the memory integrated circuit, taken along line IX-IX' of FIG. 7.

FIG. 9 is a cross-sectional view taken in the arrow direction along line IX-IX' of FIG. 7, in which the strapping word line 20 and other word lines 2 are formed on the field oxide film.

As shown in FIG. 9, the field oxide film I is formed by the selective oxidation of the semiconductor substrate 100. The gate oxide film 10A and the word line 2 are formed on the field oxide film 1. The first insulating film 5 is deposited conformaly on the semiconductor substrate 100 on which the word line 2 is formed. Though not shown in FIG. 9, the first insulating film 5 is etched so as to expose a predetermined portion of the drain region and the word line 2. Then, a polysilicon for forming the strapping word line and the bit line is deposited and etched partially, thereby forming the strapping word line 20 and the bit line (not shown). Accordingly, the word line 2, is in contact with the strapping word line 20 of the word line 2, thereby forming a word line contact 30.

In this embodiment, the four transistors share one drain. Accordingly, the memory integrated circuit can be driven with low electric power and the cell area is reduced thereby to enhance the integrated density.

Also, according to this invention, the layout of the memory cell array having the reduction area is formed easily without the additional process steps. Although the invention has been shown and described with respect to a best mode embodiment thereof, it should be understood by those skilled in the art that the foregoing and various other changes, omissions and additions in the form and detail thereof may be made therein without departing from the spirit and scope of the invention.

What is claimed is:

1. A method for manufacturing a memory integrated circuit comprising the steps of:

providing a semiconductor substrate of a first conductivity type;

forming a field oxide film on portions of the semiconductor substrate, wherein other portions of the semiconductor substrate without field oxide formed thereon form a plurality of active regions, each having an H-shape;

forming word lines passing through the active regions of the semiconductor substrate, selected word lines for connection to global word lines;

forming sources and drains of a second conductivity type in active regions exposed between the word lines;

forming a first insulating film on the semiconductor substrate on which transistors comprising the sources, the drains and the word lines are formed;

removing the first insulating film so as to expose portions of word lines unconnected to global word lines, and the drains; and forming bit lines connected to the exposed drains, and strapping word lines connected to the word lines unconnected to the global word lines, simultaneously.

2. The method for manufacturing a memory integrated circuit as claimed in claim 1, wherein the first conductivity type is a P-type.

3. The method for manufacturing a memory integrated circuit as claimed in claim 1, wherein the second conductivity type is an N-type.

4. The method for manufacturing a memory integrated circuit as claimed in claim 1, further comprising the step of forming a second insulating film as a planarizing insulating film.

5. The method for manufacturing a memory integrated circuit as claimed in claim 1, further comprising the steps of:

forming a second insulating film on the semiconductor substrate on which the bit lines and the strapping word lines are formed;

etching the second insulating film so as to expose the source regions; and forming a capacitor on the source regions.

* * * * *

UNITED STATES PATENT AND TRADEMARK OFFICE
CERTIFICATE OF CORRECTION

PATENT NO : 6,051,461
DATED : April 18, 2000
INVENTOR(S): Woo-Bong Lee et al

It is certified that error appears in the above-identified patent and that said Letters Patent are hereby corrected as shown below:

In the Abstract, at line 2, delete "the".

In the Abstract, at line 4, after "and", insert --a--.

In the Abstract, at line 5, after "word lines", insert --,--.

At column 1, line 33, after "The", insert --plurality of--.

At column 1, line 66, after "row", insert --type--.

At column 2, line 50, after "shape", insert --,--.

At column 3, line 1, delete "the" (first occurrence).

At column 3, line 28, delete "Word" and substitute --word--.

At column 3, line 58, delete "of" (second occurrence) and substitute --in--.

UNITED STATES PATENT AND TRADEMARK OFFICE
CERTIFICATE OF CORRECTION

PATENT NO : 6,051,461
DATED : April 18, 2000
INVENTOR(S): Woo-Bong Lee et al

Page 2 of 3

It is certified that error appears in the above-identified patent and that said Letters Patent are hereby corrected as shown below:

At column 3, line 58, after "of" (third occurrence), insert --an--.

At column 3, line 59, after "to", insert --the--.

At column 3, line 60, delete "line" and substitute --lines--.

At column 4, line 13, before "formed", insert --are--.

At column 4, line 13, after "region", delete ",".

At column 4, line 17, delete "the" and substitute --a--.

At column 4, line 40, delete "H shape" and substitute --H-shape--.

At column 4, line 50, delete "times" and substitute --time--.

At column 5, line 43, cancel "of the lower branch portion" and substitute --two lower branch portions--.

(Also Form PTO-1050)

UNITED STATES PATENT AND TRADEMARK OFFICE
CERTIFICATE OF CORRECTION

PATENT NO : 6,051,461
DATED : April 18, 2000
INVENTOR(S) : Woo-Bong Lee et al

Page 3 of 3

It is certified that error appears in the above-identified patent and that said Letters Patent are hereby corrected as shown below:

At column 5, line 47, cancel "left to right direction" and substitute --(left-to-right) direction--.

At column 5, line 58, delete "20D" and substitute --20B--.

At column 5, line 59, after "other", insert --so--.

At column 5, line 64, delete "two" and substitute --three--.

At column 6, line 8, delete "operated with the time" and substitute --operable electrically with respect to selected time--.

At column 6, line 59, delete "region" and substitute --regions--

At column 6, line 59, delete "the".

At column 6, line 66, delete "field the" and substitute --the field--.

Signed and Sealed this

Seventeenth Day of April, 2001

Attest:

NICHOLAS P. GODICI

Attesting Officer

Acting Director of the United States Patent and Trademark Office